(12) United States Patent
Beck

(10) Patent No.: US 10,018,699 B2
(45) Date of Patent: Jul. 10, 2018

(54) METHOD AND MAGNETIC RESONANCE APPARATUS FOR ACQUIRING MAGNETIC RESONANCE DATA WITH A PROSPECTIVE MOTION CORRECTION

(71) Applicant: Siemens Aktiengesellschaft, Munich (DE)

(72) Inventor: Thomas Beck, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 387 days.

(21) Appl. No.: 14/729,501

(22) Filed: Jun. 3, 2015

(65) Prior Publication Data

US 2015/0346307 A1 Dec. 3, 2015

(30) Foreign Application Priority Data

Jun. 3, 2014 (DE) .................. 10 2014 210 471

(51) Int. Cl.
*G01V 3/00* (2006.01)
*G01R 33/565* (2006.01)
(Continued)

(52) U.S. Cl.
CPC . *G01R 33/56509* (2013.01); *G01R 33/34092* (2013.01); *G01R 33/5673* (2013.01);
(Continued)

(58) Field of Classification Search
CPC .......... G01R 33/5676; G01R 33/56509; G01R 33/5673; G01R 33/34092; G01R 33/50;
(Continued)

(56) References Cited

U.S. PATENT DOCUMENTS

| 4,937,526 A | 6/1990 | Ehman et al. |
| 5,539,312 A | 7/1996 | Fu et al. |
(Continued)

FOREIGN PATENT DOCUMENTS

| JP | 2003190117 A | 7/2003 |
| JP | 2009279209 A | 12/2009 |
| WO | WO-2014/154544 A1 | 10/2014 |

OTHER PUBLICATIONS

Shankaranarayanan, et.al.:"Motion insensitive 3D imaging using a novel real-time image-based 3D PROspective MOtion correction method (3D PROMO)", Proc. Intl. Soc. Mag. Reson. Med., vol. 15, p. 2117, (2007).
(Continued)

*Primary Examiner* — Vinh Nguyen
(74) *Attorney, Agent, or Firm* — Schiff Hardin LLP

(57) ABSTRACT

In a method and magnetic resonance (MR) apparatus for performing an MR examination with prospective motion correction, multiple MR signals are acquired. For each MR signal, signal, an examination volume is established and a navigator volume is established for recording navigator signals. The examination volume and the navigator volume are not identical. At least one navigator reference signal is acquired at a time t0, and at least one navigator signal is acquired at a time t1>t0. Motion information is determined from the navigator signal and the navigator reference signal, and the recording parameters are set as a function of the motion information. At least one further magnetic resonance signal is acquired with this setting.

17 Claims, 3 Drawing Sheets

(51) Int. Cl.
   *G01R 33/34*   (2006.01)
   *G01R 33/563*  (2006.01)
   *G01R 33/567*  (2006.01)
   *G01R 33/50*   (2006.01)

(52) U.S. Cl.
   CPC ... *G01R 33/5676* (2013.01); *G01R 33/56383* (2013.01); *G01R 33/50* (2013.01)

(58) Field of Classification Search
   CPC ............ G01R 33/56383; G01R 33/385; G01R 33/4828; G01R 33/46; G01R 33/4836; G01R 33/4838; G01R 33/543; G01R 33/56572; G01R 33/583; G01R 33/20; G01R 33/34; G01R 33/4835; G01R 33/5611; G01N 24/08; A61B 5/055; A61B 5/7207; A61B 5/0263; A61B 5/11; A61B 5/113; A61B 2576/02; A61B 5/004; A61B 5/4244; A61B 5/742; A61B 5/748
   See application file for complete search history.

(56) References Cited

U.S. PATENT DOCUMENTS

| | | | |
|---|---|---|---|
| 6,118,273 | A | 9/2000 | Takizawa et al. |
| 2002/0130660 | A1 | 9/2002 | Thesen |
| 2003/0135105 | A1 | 7/2003 | Jack et al. |
| 2008/0054899 | A1 | 3/2008 | Aksoy et al. |
| 2009/0116761 | A1 | 5/2009 | Wheaton et al. |
| 2013/0049756 | A1 | 2/2013 | Ernst et al. |
| 2013/0249553 | A1* | 9/2013 | Simonetti .......... G01R 33/4828 324/309 |
| 2013/0278263 | A1 | 10/2013 | Huang et al. |
| 2015/0323637 | A1* | 11/2015 | Beck .................. G01R 33/4828 600/410 |

OTHER PUBLICATIONS

McConnell et al; "Prospective Adaptive Navigator Correction for Breath-Hold MR Coronary Angiopraphy"; Magnetic Resonance in Medicine; vol. 37; pp. 148-152 (1997).

Wright et al; "Real-Time MR Fluoroscopic Data Acquisition and Image Reconstruction"; Magnetic Resonance in Medicine; vol. 12; pp. 407-415; (1989).

Ward et al; "Prospective Multiaxial Motion Correction for fMRI"; Magnetic Resonance in Medicine; vol. 43; Seiten pp. 459-469; (2000;).

Thesen et al: "Prospective Acquisition Correction for Head Motion With Image-Based Tracking for Real-Time fMRI" Magnetic Resonance in Medicine vol. 44, pp. 457-465, (2000).

Tisdall et al.:"MPRAGE Using EPI Navigators for Prospective Motion Correction", in: Proc. Intl. Soc. Mag. Reson. Med. 17, p. 4656, (2009).

MacLaren.; "Prospective Motion Correction in Brain Imaging: A Review"; Magnetic Resonance in Medicine; vol. 69; pp. 621-636; (2013).

Thesen, "Retrospective and Prospective methods for Image-based Correction of Patient Head Movements in Neurofunctional Magnetic Resonance Tomography, in Real Time," Doctoral Dissertation, Heidelberg University (2001).

* cited by examiner

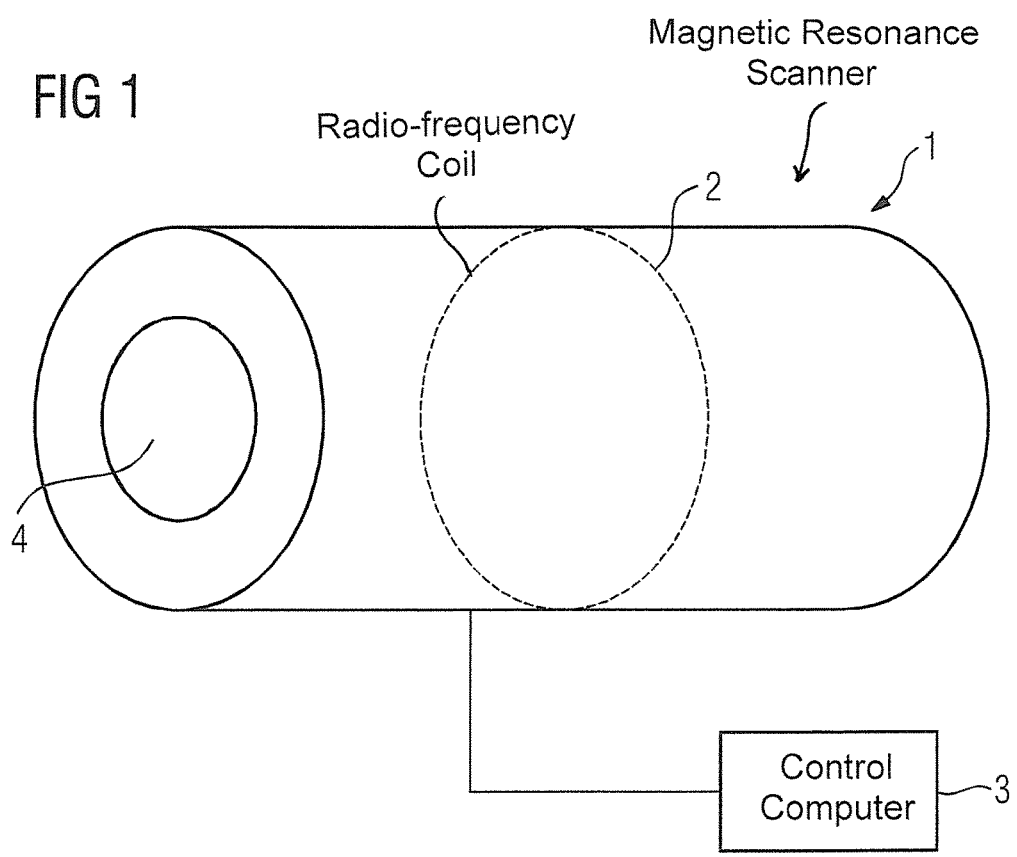

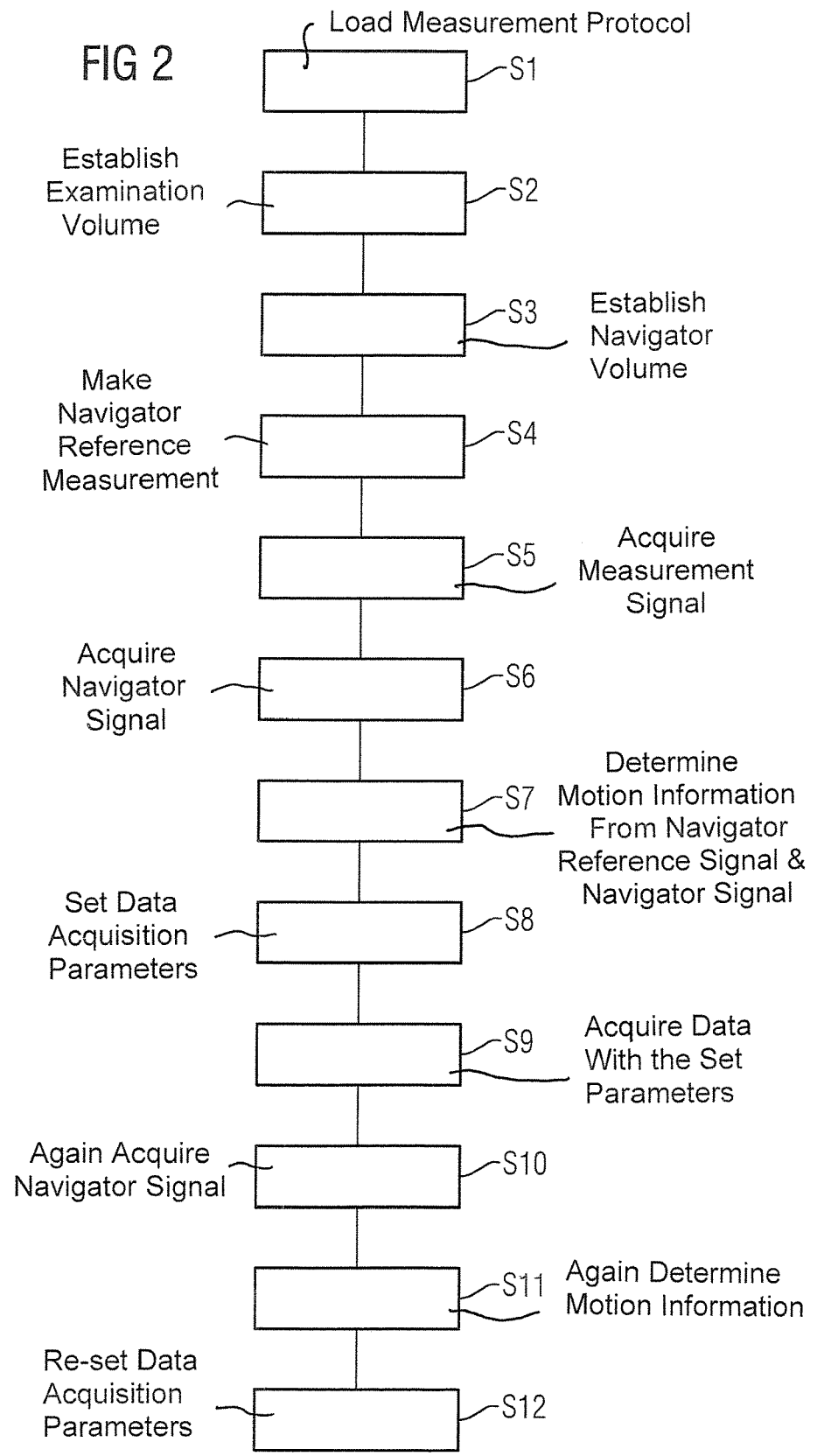

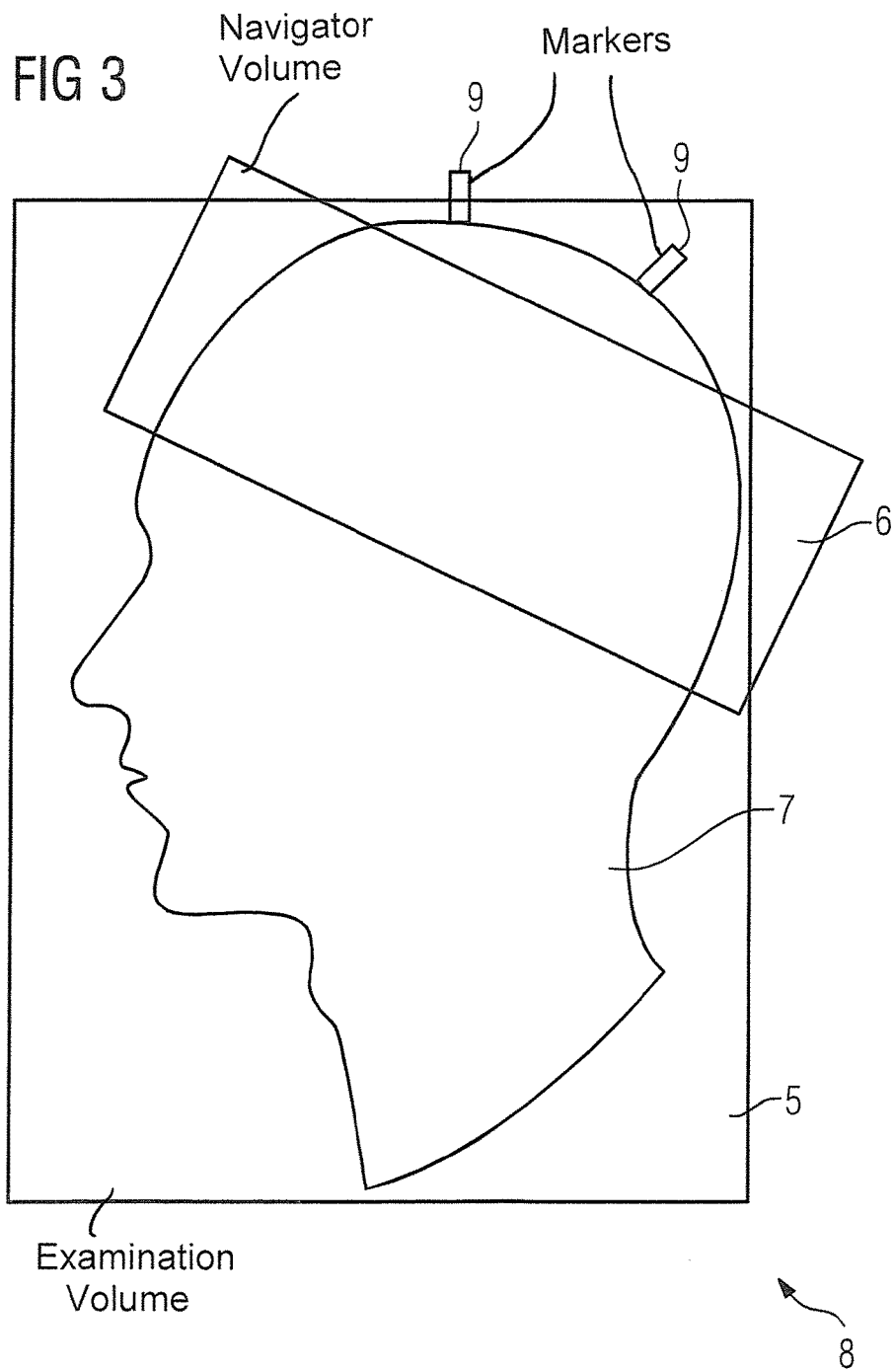

METHOD AND MAGNETIC RESONANCE APPARATUS FOR ACQUIRING MAGNETIC RESONANCE DATA WITH A PROSPECTIVE MOTION CORRECTION

BACKGROUND OF THE INVENTION

Field of the Invention

The present invention concerns a method for operating a magnetic resonance apparatus in order to acquire magnetic resonance data with a prospective motion correction, as well as a magnetic resonance apparatus that is operable according to such a method.

Description of the Prior Art

Magnetic resonance signals or measured data are recorded (acquired) in magnetic resonance examinations, in order to generate spectra or images therefrom. When images are recorded, k-space, from which the images are reconstructed, can be filed line-by-line or point-by-point with the acquired (raw) data.

In some sequences and in optimum basic conditions it is possible to record so-called 4D data records. These are 3D data records that are repeatedly recorded in series. Such records are time-consuming to acquire, for which reason the acquisition of 4D data records with an acceptable time resolution represent a particular challenge. The images obtained in this way only show anatomical structures.

In contrast, magnetic resonance examinations for functional MRI as well as T1 maps intrinsically require at least a few minutes, since the T1 relaxation curve cannot be scanned any faster, even using the most efficient method.

A problem is that the examination object may exhibit motion or may move in this period of time. These motions result in motion artifacts in the reconstructed images.

Several methods are known for preventing motion artifacts in general.

Gating methods are known wherein the magnetic resonance examination is interrupted if the examination subject has moved out of a reference position. As soon as the subject is again at this position, the magnetic resonance examination is continued. In the case of periodic motions such as breathing and heartbeat this is easy to implement and can be triggered by an ECG. This method cannot be used, however, in the case of translatory motions, also called "bulk motions", since in these the reference position sometimes cannot be achieved again. In addition, with this method it is not possible to keep the temporal repetition rate for image acquisition constant.

Furthermore it is known for the magnetic resonance signals to be corrected retrospectively, in other words after the recording. Several variants are possible in this category.

Firstly, markers can be securely attached to the patient and their motion can be plotted. Furthermore it is possible to record magnetic resonance signals known as navigator echoes. This type of retrospective correction of the recorded measured signals is known, for example, from U.S. Pat. No. 4,937,526 or U.S. Pat. No. 5,539,312.

Furthermore it is possible to correct the measured signals prospectively. In this case a continuous check is made during an examination to check whether the examination object has moved, in order to adjust the subsequent data recording to the motion, for example by adjusting the gradient settings. The advantage of this procedure is that the measured signals can be directly further processed after the recording. A prospective motion correction is known from Tisdall et al., MPRAGE Using EPI Navigators for Prospective Motion Correction, Proc. Intl. Soc. Magn. Reson. Med., 17, p. 4656, 2009.

In prospective motion correction, it is necessary for the navigator signals to be processed quickly. Hence rigid registration is preferred over elastic registration.

A problem with this is that incorrect registrations occur, especially when it is the head that is being examined. These become apparent as motion artifacts that are still present despite the motion correction.

SUMMARY OF THE INVENTION

An object of the present invention to provide a method that is less prone to error for performing a magnetic resonance examination with a prospective motion correction.

This object is achieved in a method and magnetic resonance (MR) apparatus for performing an MR examination with prospective motion correction, wherein multiple MR signals are acquired. For each MR signal, signal, an examination volume is established and a navigator volume is established for recording navigator signals. The examination volume and the navigator volume are not identical. At least one navigator reference signal is acquired at a time t0, and at least one navigator signal is acquired at a time t1>t0. Motion information is determined from the navigator signal and the navigator reference signal, and the recording parameters are set as a function of the motion information. At least one further magnetic resonance signal is acquired with this setting.

An important feature of the invention is that the volume from which the navigator signals are acquired and the examination volume from which the measured signals are recorded are not identical. It has been shown that non-rigid motions in the examination volume can significantly disrupt the motion correction with rigid registration, for which reason conventional motion correction is not performed optimally. Accordingly, the invention departs from the procedure consistently used in the past of also using the examination volume as a navigator volume, in other words as a volume from which navigator signals are acquired. This applies both for 2D and 3D image data, as well as for spectra. The acquisition data for slices also is considered to a "volume" in the context of the use.

In principle the non-identity of the volume from which navigator signals are acquired and the examination volume results from any deviation between those two volumes, and a change can be made in the length in the readout and/or phase and/or slice direction. Alternatively or additionally, the navigator volume can be shifted or rotated compared to the examination volume.

Preferably a navigator volume is used that is smaller than the examination volume. As described, disturbing effects should be avoided during the registration. Thus it is expedient to omit particularly problematic image areas during the registration. The navigator volume should then be selected to be smaller than the examination volume.

Particularly advantageously, a partial volume of the examination volume can be used as the navigator volume. In principle, it is also possible to use an area outside the examination volume for recording the navigator signals, if the examination volume and the navigator volume are rigidly linked to one another. Since, depending on the resolution that is selected, even deviations in the range of a few μm may become problematic, the navigator volume for preventing such sources of error is a partial volume of the examination volume. This does not require the axes of the examination volume and of the navigator volume to be aligned in parallel. This is merely one possible configuration.

Particularly preferably, the alignment of the navigator volume is determined as a function of a partial area of the examination object. Whereas the examination volume is aligned to the entire examination object, the navigator volume is aligned as a function of a partial area of the examination object. The examination object is in this case the part of the patient or other subject of the examination that is captured during the data recording. It is therefore the part which lies within the examination volume.

During an examination of the head of a subject, a volume above the jaw, in particular above the nose, is preferable as the navigator volume. In this case, the volume or navigator volume above the jaw is preferably a partial volume of the examination volume. The volume used as a navigator volume preferably includes the cranium. Preferably the navigator volume is restricted to the cranium and does not include the facial bones.

Preferably, a part of the examination area that is essentially rigid is used as a navigator volume. This is because motions of this part of the examination area occur uniformly in the whole area. This means error is minimized in the case of rigid registration.

Preferably, marker-based motion information can be used for the motion correction. All known markers can be used as markers, in particular laser-based markers. The markers are attached to the outside of the examination object. The position is continuously captured by these markers. This is done, for example, using optical measuring devices. Preferably the marker-based motion information is only taken into consideration if the motion determined therefrom exceeds a predefined threshold value. The marker-based motion information should in this case supplement the navigator-based motion information such that it can be used to capture motions which are the multiple of the width of a pixel or voxel.

Particularly advantageously the motion information is determined on the basis of a rigid registration. In particular, the motion information can be determined using a cross-correlation analysis. In this, several cross-correlation coefficients are calculated and the cross-correlation coefficient with the highest numerical value indicates the position of the best match between the reference data and the data obtained from the current navigator echo.

Preferably navigator echoes are used as the navigator signals.

Preferably the navigator signal recorded at a time t1 is used at a later time t2 as a navigator reference signal. In other words, the most recently measured navigator signal is used as a navigator reference signal in each case. The navigator reference signal thus changes continuously. Alternatively, the navigator reference signal can be changed during every second, third, fourth, etc. measured signal recording. This stops the navigator signals and the navigator reference signals from diverging ever further from one another. In this case the navigator signal that is to be used as a navigator reference signal should be adapted to the changed parameters when there is a change in the recording parameters, as occurs in the case of a retrospective motion correction.

The navigator signals can undergo post-processing steps such as a baseline correction, zero filling and/or a Fourier transformation prior to the cross-correlation analysis.

Preferably, a 3D image data record can be used as a navigator signal and navigator reference signal in each case to determine motion information. With the coverage of the 3D volume every motion can be captured. Thus six degrees of freedom of motion can be covered, namely three translatory and three rotational degrees of freedom.

The object of the present invention is also achieved by a magnetic resonance system having a scanner and a control computer. The control computer is configured to control the scanner so as to perform the method as described above.

The scanner has a radio-frequency coil designed as a surface coil, birdcage coil, or coil array.

The aforementioned method can be implemented in the control computer as software or as (hard-wired) hardware.

The embodiments of the inventive method described above apply to the inventive magnetic resonance apparatus as well.

BRIEF DESCRIPTION OF THE DRAWINGS

FIG. 1 schematically illustrates a magnetic resonance system.

FIG. 2 is a flowchart of the method according to the invention.

FIG. 3 illustrates an examination area for explaining the invention.

DESCRIPTION OF THE PREFERRED EMBODIMENTS

FIG. 1 shows a magnetic resonance scanner 1 with at least one radio-frequency coil 2. The radio-frequency coil 2 is a reception coil and is specifically matched to the examination area. For measurements of the head, it is a head coil. A control computer 3 is furthermore provided. All measurement procedures are stored as measurement protocols in the control computer 3.

Once a patient is positioned on a patient table and has been introduced into the bore 4 of the magnetic resonance scanner 1, adjustment measurements are made, such as setting shim coils and determining the resonance frequency. The actual magnetic resonance examinations then begin. To perform a magnetic resonance examination, a measurement protocol is normally loaded and its settings are checked. Most of the parameters are preset or are entered automatically, such as the resonance frequency for example. The examination volume can be optimized manually, but there are also procedures for setting the examination volume automatically.

If the examination subject is a patient, the examination area may be the head, a knee, the chest, etc. The examination volume includes or forms the examination area.

FIG. 2 shows the performance of a magnetic resonance examination with a prospective motion correction as a flow diagram, while FIG. 3 shows the examination volume in cross-section. A measurement protocol is loaded in step S1. On the basis of so-called scout measurements or other measured data or otherwise automatically, the examination volume 5 is established in step S2, as is the navigator volume 6 in step S3.

The head 7 or a part of the head 7 of the patient 8 is provided as the examination area. The navigator volume 6 is preferably a partial volume of the examination volume 5. It is placed in the cranium of the head 7. In this area the head 7 is rigid, i.e. in this area the head only moves as a whole and does not make any counter-rotating movements, as may be the case in the area of the jaw.

Although the navigator volume 6 does not lie completely in the examination volume 5, the portion outside supplies only noise signals. In this case the navigator volume 6 is regarded as a partial volume of the examination volume 5.

In addition it is also possible for the navigator volume 6 to overlap the examination volume 5 only partially. Then a part of the navigator signal is obtained outside the examination volume 5.

In extreme cases the navigator volume 6 and the examination volume 5 do not overlap at all. The advantage of this is that the relaxation path in the examination volume 5 is identical and is not partially changed by the navigation measurements.

Markers 9 are optionally also attached to the head 7. Their position is detected using an optical measuring device, in particular a laser measuring device, in order thereby to establish motions of the head 7. The markers serve to identify larger motions, in particular motions which are longer than the width of ten voxels or pixels. Large motions of this type may result in errors during the cross-correlation analysis. The motion detection using the markers 9 supplements the prospective motion correction with navigator echoes in the event of large motions. In the case of smaller motions, i.e. smaller than or identical to the width of 10 voxels, a motion correction is in contrast made with a larger weighting using the motion information from the navigator echoes. A limit value other than 10 widths can also be predefined. It is important that supplementary motion information can be taken into consideration. This can be averaged on a weighted basis, in order to generate overall motion information.

Again with reference to FIG. 2, it should be mentioned that steps S2 and S3 can also be performed in the reverse order. Since the navigator volume 6 and the examination volume 5 are independent of one another, they can also be established independently of one another. The order is then irrelevant, however.

A navigator reference measurement is made as step S4 at time t0. This step cannot take place until the navigator volume 6 has been established, but it need not take place immediately after. 3D image data records with a resolution of e.g. 32×32×32 voxels are preferably used here. An EPI is furthermore preferably used as a sequence.

A measured signal is recorded in step S5. This is preferably an echo, in other words a k-space line. It may however also be an FID, which is used to calculate a spectrum. In spectroscopic sustained measurements motion artifacts can degrade the spectrum just as much as is the case during imaging.

The measured signals and the navigator signals are both magnetic resonance signals; one or more images or a spectrum are obtained from the measured signals, and motion information is obtained from the navigator signals.

Three navigator signals are then recorded as step S6 at time t1, wherein the navigator signals are encoded in just the same way as navigator reference signals in step S4. A difference in the signals therefore stems from a motion of the head.

Accordingly the determination of motion information from the navigator signals and the navigator reference signals takes place as step S7. It is also understood by this that the motion takes place in several directions, in other words in three translatory directions and three rotational directions. The motion information is obtained from the 3D image data records using an optimization procedure.

In step S8 the recording parameters, in particular the gradient settings, are set. The gradient values are changed if a motion was identified in step S7. The motions established in each case in one direction can be added to form an overall motion or a gradient correction can be made to each direction and the corrections added. If no motion was established in step S7, the gradient values remain unaltered. Both alternatives, amending or retaining the recording parameters, are subsumed under the term "setting the recording parameters".

A further measured signal is then acquired as step S9. Then navigator signals are recorded again in step S10, motion information is determined in step S11 and the recording parameters are set in step S12.

Since the motion correction takes place before/during the recording of the measured signals and during the magnetic resonance examination, this is a prospective motion correction.

Measured signals and navigator signals are then recorded alternately, motion information is determined and the recording parameters are set, until all measured signals have been acquired. Once the last measured signal has been recorded the method for performing a magnetic resonance examination terminates. The measured signals can also be recorded using a coil array.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance data with motion correction, comprising:
   (a) in a control computer of a magnetic resonance scanner, establishing an examination volume in a subject from which magnetic resonance signals are to be acquired by operation of said magnetic resonance scanner;
   (b) in said control computer, establishing a navigator volume in the examination subject, that is not identical to the established examination volume, from which navigator signals are to be acquired by operation of said magnetic resonance scanner;
   (c) in said control computer, generating navigator control signals based on the established navigator volume and, from said control computer, emitting said navigator control signals to said magnetic resonance scanner and thereby operating said magnetic resonance scanner to acquire at least one navigator signal, serving as a navigator reference signal, from said navigator volume at a time t0;
   (d) from said control computer, also operating said magnetic resonance scanner with said navigator control signals to acquire at least one further navigator signal from said navigator volume at time t1>t0;
   (e) in said control computer, determining navigator volume motion of the established navigator volume as a difference between the further navigator signal and the navigator reference signal;
   (f) in said control computer, setting data acquisition parameters based on said navigator volume motion and the established examination volume, and generating examination control signals that electronically represent the set data acquisition parameters and, from said control computer, emitting said examination control signals to said magnetic resonance scanner and thereby operating said magnetic resonance scanner according to said set data acquisition parameters to acquire a magnetic resonance signal from said examination volume; and
   (g) compiling a data record of magnetic resonance signals from said established examination volume by, from said control computer, repeating (d) through (f) until all signals for said data record have been acquired from said established examination volume, and making said data record available in electronic form as a data file from said control computer.

2. A method as claimed in claim 1 comprising, in (b), establishing said navigator volume to be smaller than said established examination volume.

3. A method as claimed in claim 1 comprising, in (b), establishing said navigator volume as a partial volume of said established examination volume.

4. A method as claimed in claim 1 comprising, in (a), establishing a head of the examination subject as said examination volume and, in (b), establishing a partial volume within the head above a jaw of the subject as said navigator volume.

5. A method as claimed in claim 1 comprising, in (a), establishing a head of the examination subject as said examination volume and, in (b), establishing a partial volume within the head above a nose of the subject as said navigator volume.

6. A method as claimed in claim 1 comprising, in (b), establishing said navigator volume as a partial volume of the established examination volume that is rigid.

7. A method as claimed in claim 1 comprising applying extracorporeal markers to the examination subject at said established examination volume, said markers exhibiting marker motion, due to motion of said examination volume, that is different from said navigator volume motion, said markers being detectable in an image reconstructed from said magnetic resonance signals, and, in said control computer, implementing a correction in said image due to said examination volume motion, dependent on positions of said markers detected in said image.

8. A method as claimed in claim 1 comprising, in (e), determining said navigator volume motion by, in said control computer, bringing said further navigator signal and said navigator reference signal into registration with each other.

9. A method as claimed in claim 1 comprising, in (b), establishing said navigator volume with an alignment in said examination subject that is dependent on a predetermined area of said examination subject.

10. A method as claimed in claim 1 wherein said examination control signals define an operating sequence for said magnetic resonance scanner in which navigator echoes are produced and wherein said method comprises, in (d), operating said magnetic resonance scanner with said navigator control signals to acquire said at least one navigator signal from said navigator echoes.

11. A method as claimed in claim 1 comprising, in (g), using the further navigator signal acquired in (d) as the navigator reference signal in (e).

12. A method as claimed in claim 1 comprising, in (c) and (d), acquiring each of said at least one navigator reference signal and said at least one navigator signal as a 3D data record.

13. A method as claimed in claim 1 comprising, in (b), establishing said navigator volume automatically based on landmarks of said examination subject provided to said control computer.

14. A method as claimed in claim 1 comprising, in (f), operating said magnetic resonance scanner to acquire said magnetic resonance signal according to a pulse sequence, represented by said examination control signals, that causes gradient magnetic fields, with respective gradient values, to be activated, and including said gradient values in said magnetic resonance data acquisition parameters that are set.

15. A method as claimed in claim 1 comprising, in said control computer, reconstructing image data from said data record and displaying an image of the examination volume, represented by said image data, at a display in communication with said control computer.

16. A magnetic resonance apparatus comprising:
a magnetic resonance scanner;
a control computer of the magnetic resonance scanner, configured to (a) establish an examination volume in a subject from which magnetic resonance signals are to be acquired by operation of said magnetic resonance scanner;
said control computer being configured to (b) establish a navigator volume in the examination subject, that is not identical to said examination volume, from which navigator signals are to be acquired by operation of said magnetic resonance scanner;
said control computer being configured to (c) generate navigator control signals based on the established navigator volume and, from said control computer, emit said navigator control signals to said magnetic resonance scanner and thereby operate said magnetic resonance scanner to acquire at least one navigator signal, serving as a navigator reference signal, from said navigator volume at a time t0;
said control computer being configured to (d) also operate said magnetic resonance scanner with said navigator control signals to acquire at least one further navigator signal from said navigator volume at time t1>t0;
said control computer being configured to (e) determine navigator volume motion of the established navigator volume from a difference between the further navigator signal and the navigator reference signal;
said control computer being configured to (f) set magnetic resonance data acquisition parameters based on said navigator volume motion and the established examination volume, and generate examination control signals that electronically represent the set data acquisition parameters and, from said control computer, emit said examination control signals to said magnetic resonance scanner and thereby operate said magnetic resonance scanner according to said set magnetic resonance data acquisition parameters to acquire a magnetic resonance signal from said examination volume; and
said control computer being configured to compile a data record of magnetic resonance signals from said examination volume by (d) through (f) until all signals for said data record have been acquired from said examination volume, and to make said data record available in electronic form as a data file from said control computer.

17. A magnetic resonance apparatus as claimed in claim 16 wherein said control computer is configured to reconstruct image data from said data record and to display an image of said examination volume, represented by said image data, at a display in communication with said control computer.

* * * * *